United States Patent
Young et al.

(10) Patent No.: US 10,693,265 B2
(45) Date of Patent: Jun. 23, 2020

(54) BUS BAR AND POWER ELECTRONIC DEVICE WITH CURRENT SHAPING TERMINAL CONNECTOR AND METHOD OF MAKING A TERMINAL CONNECTOR

(71) Applicant: General Electric Company

(72) Inventors: Henry Todd Young, Erie, PA (US); Alvaro Jorge Mari Curbelo, Oberschleissheim (DE); Jason Daniel Kuttenkuler, Erie, PA (US); Tiziana Bertoncelli, Munich (DE); Sean Patrick Cillessen, Erie, PA (US)

(73) Assignee: GE GLOBAL SOURCING LLC, Norwalk, CT (US)

( * ) Notice: Subject to any disclaimer, the term of this patent is extended or adjusted under 35 U.S.C. 154(b) by 0 days.

(21) Appl. No.: 16/149,946

(22) Filed: Oct. 2, 2018

(65) Prior Publication Data
US 2019/0036284 A1    Jan. 31, 2019

Related U.S. Application Data

(62) Division of application No. 15/524,288, filed as application No. PCT/US2015/061217 on Nov. 18, 2015, now Pat. No. 10,128,625.
(Continued)

(51) Int. Cl.
*H02M 7/00* (2006.01)
*H02G 5/00* (2006.01)
(Continued)

(52) U.S. Cl.
CPC .......... *H01R 25/162* (2013.01); *H01L 23/46* (2013.01); *H01L 23/492* (2013.01);
(Continued)

(58) Field of Classification Search
CPC ..... H02M 7/003; H05K 7/2089; H05K 7/209; H05K 7/20927
See application file for complete search history.

(56) References Cited

U.S. PATENT DOCUMENTS 5,528,073 A    6/1996 Gilmore
5,777,377 A    7/1998 Gilmore
(Continued)

FOREIGN PATENT DOCUMENTS

| | | |
|---|---|---|
| CN | 101385225 A | 3/2009 |
| JP | 2008118774 A | 5/2008 |
| JP | 4863164 B2 | 1/2012 |

OTHER PUBLICATIONS

CN Office Action for corresponding CN Application No. 201580073801.3 dated Oct. 19, 2018 (8 pages).
(Continued)

*Primary Examiner* — Robert J Hoffberg
(74) *Attorney, Agent, or Firm* — Christopher R. Carroll; The Small Patent Law Group LLC

(57) ABSTRACT

A current shaping phase leg bus bar for power electronics systems includes a first terminal connector, a second terminal connector, insulated from the first terminal connector, and a third terminal connector, insulated from the first and second terminal connectors. At least one of the terminal connectors is a current shaping terminal connector that includes one or more layers having a plurality of pre-defined locations for electrical connections, said plurality of pre-defined locations including one or more first locations and a plurality of second locations, and includes one or more gaps within or among its one or more layers, to provide substantially balanced conductive pathways among its one or more first locations and its plurality of second locations.

13 Claims, 12 Drawing Sheets

Related U.S. Application Data

(60) Provisional application No. 62/081,179, filed on Nov. 18, 2014.

(51) Int. Cl.
*H05K 7/20* (2006.01)
*H01R 25/16* (2006.01)
*H02M 3/155* (2006.01)
*H01L 23/46* (2006.01)
*H01L 23/492* (2006.01)
*H01L 23/00* (2006.01)
*H01L 25/11* (2006.01)
*H01R 43/16* (2006.01)
*H02M 7/537* (2006.01)

(52) U.S. Cl.
CPC .......... *H01L 23/562* (2013.01); *H01L 25/115* (2013.01); *H01R 43/16* (2013.01); *H02G 5/005* (2013.01); *H02M 3/155* (2013.01); *H02M 7/003* (2013.01); *H05K 7/2089* (2013.01); *H05K 7/20927* (2013.01); *H02M 7/537* (2013.01)

(56) References Cited

U.S. PATENT DOCUMENTS

| | | | |
|---|---|---|---|
| 6,238,225 B1 | 5/2001 | Middlehurst et al. | |
| 6,473,294 B1* | 10/2002 | Maier | H02B 1/56 361/601 |
| 6,548,972 B2 | 4/2003 | Takagi | |
| 7,436,672 B2* | 10/2008 | Ushijima | H01L 25/162 165/104.33 |
| 7,869,193 B2* | 1/2011 | Nohara | H02M 5/271 361/624 |
| 8,232,856 B2* | 7/2012 | Zeng | H01F 27/38 336/107 |
| 8,922,978 B2* | 12/2014 | Brett | H02B 1/40 174/99 B |
| 9,241,428 B1* | 1/2016 | Doo | H05K 7/20927 |
| 10,263,407 B1* | 4/2019 | Song | B60L 50/50 |
| 10,326,378 B2* | 6/2019 | Doo | H05K 7/20927 |
| 2004/0230847 A1 | 11/2004 | Patwardhan et al. | |
| 2007/0193767 A1 | 8/2007 | Parkhill et al. | |
| 2010/0177464 A1 | 7/2010 | Strong et al. | |
| 2011/0151315 A1 | 6/2011 | Masson et al. | |
| 2012/0188686 A1* | 7/2012 | Brett | H02B 1/20 361/624 |
| 2012/0217032 A1 | 8/2012 | Beaupre et al. | |
| 2018/0097416 A1* | 4/2018 | Dang | H02K 3/28 |

OTHER PUBLICATIONS

Examination Report issued in connection with corresponding IN Application No. 201747020288 dated Apr. 30, 2019.

\* cited by examiner

| R or L | a1 | b1 | c1 | a2 | b2 | c2 | a3 | b3 | c3 |
|---|---|---|---|---|---|---|---|---|---|
| a1 | a1 | a1b1 | a1c1 | a1a2 | a1b2 | a1c2 | a1a3 | a1b3 | a1c3 |
| b1 | a1b1 | b1 | b1c1 | b1a2 | b1b2 | b1c2 | b1a3 | b1b3 | b1c3 |
| c1 | a1c1 | b1c1 | c1 | c1a2 | c1b2 | c1c2 | c1a3 | c1b3 | c1c3 |
| a2 | a1a2 | b1a2 | c1a2 | a2 | a2b2 | a2c2 | a2a3 | a2b3 | a2c3 |
| b2 | a1b2 | b1b2 | c1b2 | a2b2 | b2 | b2c2 | b2a3 | b2b3 | b2c3 |
| c2 | a1c2 | b1c2 | c1c2 | a2c2 | b2c2 | c2 | c2a3 | c2b3 | c2c3 |
| a3 | a1a3 | b1a3 | c1a3 | a2a3 | b2a3 | c2a3 | a3 | a3b3 | a2c3 |
| b3 | a1b3 | b1b3 | c1b3 | a2b3 | b2b3 | c2b3 | a3b3 | b3 | b3c3 |
| c3 | a1c3 | b1c3 | c1c3 | a2c3 | b2c3 | c2c3 | a3c3 | b3c3 | c3 |

BUS BAR AND POWER ELECTRONIC DEVICE WITH CURRENT SHAPING TERMINAL CONNECTOR AND METHOD OF MAKING A TERMINAL CONNECTOR

CROSS-REFERENCE TO RELATED APPLICATIONS

This application is a divisional of and claims priority to U.S. patent application Ser. No. 15/524,288, filed on 4 May 2017, which is a national stage entry of and claims priority to International Patent Application No. PCT/US2015/061217, filed on 18 Nov. 2015, which claims priority to U.S. Provisional Application No. 62/081,179, filed on 18 Nov. 2014, the entire disclosures of which are incorporated herein by reference.

BACKGROUND

Technical Field

Embodiments of the invention relate generally to power electronics, e.g., switching devices. Particular embodiments relate to power electronic devices in which plural switching devices are packaged together.

Discussion of Art

Trains typically feature a number of cars that are pushed or pulled by a locomotive. The locomotive has traction wheels engaged with the track. In modern designs, electric wheel motors drive the traction wheels. The electric wheel motors are powered via electrical distribution from one or more engine-driven generators housed within the locomotive. The traction wheels and wheel motors can be reversibly configured, to also act as brakes for slowing the locomotive.

Similarly, in the mining industry, large off-highway vehicles ("OHVs") usually employ electrically motorized wheels for propelling or retarding the vehicle. In particular, OHVs typically include a large horsepower diesel engine in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the two wheel drive assemblies.

In both locomotive and OHV applications, solid-state power converters are used to provide high voltage current from the generators or alternators to the wheel motors. Such power converters include inductive coils to step down the voltage as well as semiconductor power switches to commutate the current. Although the above-described applications are typical, it will be appreciated that power converters can be used in many other settings.

Generally, operation of a power converter is accomplished by applying alternately two different gate voltage levels to individual semiconductor power switches via corresponding gate drive units. Exemplary semiconductor power switches include IGBTs as well as BIGTs. Semiconductor power switches, however, are subject to cyclic thermal stresses. More specifically, while driven by a gate voltage, each power switch conducts significant current in a forward direction at a relatively small voltage drop across the switch. Despite the relatively low voltage across the forward-biased power switch, resistive heating nonetheless occurs. As will be appreciated, when gate voltage is removed, each semiconductor ceases to conduct (except for leakage current). Thus, with proper thermal design, a power switch not driven by gate voltage should cool toward ambient temperature.

Although durability is a consideration in semiconductor design, electrical design constraints entail that the various layers of the semiconductor power switches are fabricated from materials having differing thermal properties; in particular, differing coefficients of thermal expansion. As a result, over time, thermal stress can potentially cause delamination, debonding of terminals, or fatigue cracking. Thermal stress can also cause electrochemical failures such as current filamenting and Kirkendall void formation.

Thermal stress effects can be rendered more predictable, and can be mitigated, by maintaining the heating/cooling cycle within a design envelope defined to minimize temperature swings despite continual on/off cycling. For example, semiconductor power switches may be specially packaged with reference to a heat sink or coolant conduit, such that all of the power switches mounted on the heat sink are at a generally common temperature. Such switches are commonly referred to as "isothermal switches."

Structural configurations of isothermal switches, however, may present challenges in electrical circuit balancing. For example, switch electrical connection points are split into multiple terminals to allow high currents. Terminal connectors are then used to provide a common electrical connection of the multiple terminals. Typically, a terminal connector includes a conductive layer sandwiched between insulative layers. The terminal connector is connected to the multiple terminals most often by screws, although other fastening methods may be used. While such packaging arrangements often provide operational benefits with isothermal switches, they may present challenges in keeping the circuit "electrically balanced" such that all electrical terminals belonging to the same electric point see the same current flow and hence the same power losses. Electrically unbalanced systems (those where electrical terminals belonging to the same electric point do not see the same current flow and power losses) may show undesirable electric behaviors in the circuit, since the switching devices will be at different operating points far from the ones foreseen by design and not balanced.

In view of the above, it may be desirable to optimize both electrical and thermal parameters of semiconductor switches in a power converter in order to control resistance and keep stray inductance values as low as possible.

BRIEF DESCRIPTION

Embodiments of the invention relate to a bus bar (e.g., a current shaping phase leg bus bar for power electronics systems), which includes a first terminal connector, a second terminal connector, which is insulated from the first terminal connector, and a third terminal connector, which is insulated from the first and second terminal connectors. At least one of the terminal connectors is a current shaping terminal connector that includes one or more layers having a plurality of pre-defined locations for electrical connections (e.g., electrical connections for transistors or other semiconductor switches). The plurality of pre-defined locations includes one or more first locations and a plurality of second locations. The current shaping terminal connector also includes one or more gaps within or among its one or more layers, to provide substantially balanced conductive pathways among its one or more first locations and its plurality of second locations.

In an embodiment, a power electronic device includes a heat sink that has a coolant inlet and a coolant outlet, and first and second switch packages, each package having supply terminals and load terminals. The supply terminals of the first and second switch packages are substantially thermally equidistant from the coolant inlet at a first thermal distance, and the load terminals of the first and second switch packages are substantially thermally equidistant from the coolant inlet at a second thermal distance that is less than the first thermal distance. The power electronic device also includes at least one current shaping terminal connector connecting the load terminals of the first and second switch packages. The current shaping terminal connector includes one or more layers having a plurality of pre-defined locations for electrical connections. The plurality of pre-defined locations including one or more first locations and a plurality of second locations. The current shaping terminal connector also includes one or more gaps within or among its one or more layers, to provide substantially balanced conductive pathways among its one or more first locations and its plurality of second locations.

Aspects of the invention provide a method of making a current shaping terminal connector, which includes forming at least one conductive plate; forming on the at least one conductive plate a plurality of pre-defined locations, including at least one first location and a plurality of second locations; and forming in or about the conductive plate at least one gap that is configured to impose substantially balanced electrical pathways among the at least one first location and the plurality of second locations.

DRAWINGS

The present invention will be better understood from reading the following description of non-limiting embodiments, with reference to the attached drawings, wherein below:

DETAILED DESCRIPTION

Figure 1:
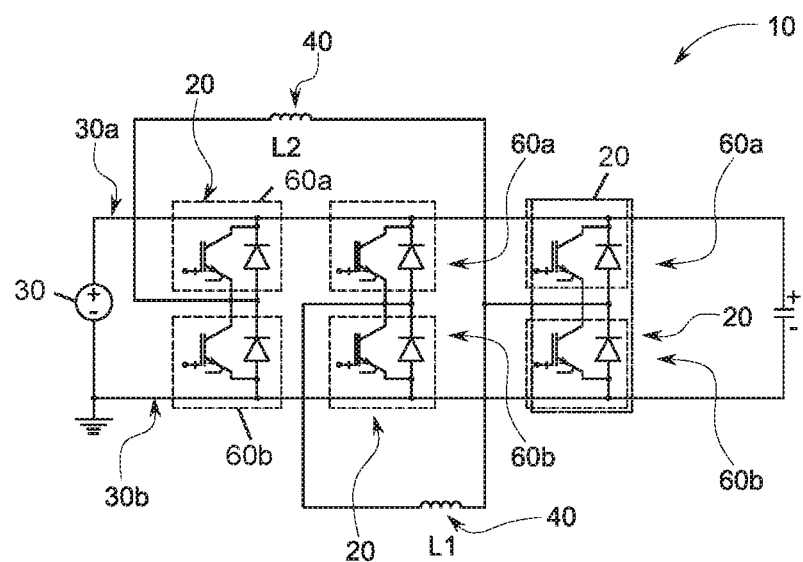
FIGS. 1 and 2 are schematic views of power converters for traction applications.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to traction power converters, embodiments of the invention also are applicable generally for use in any system that commutates an output with the poles of a DC power supply.

FIG. 1 shows, schematically, a power converter 10 for traction applications. The power converter 10 includes a plurality of phase legs 20 that are connected between a DC link 30 and a plurality of phase windings 40, which may be windings of, e.g., a traction motor or a transformer. Each phase leg 20 includes a pair of "switch packages" (power electronic devices) 60a, 60b, one being a high-potential switch package 60a that is connected from a high voltage bus 30a of the DC link 30 to a terminal of one of the phase windings 40, and the other being a low-potential switch package 60b that is connected from the same terminal of the same phase winding 40 to a low potential bus 30b of the DC link 30. Thus, each phase winding 40 is connected between two phase legs 20 comprising four switch packages 60. In operation, the switch packages 60 commutate the phase winding 40 with the DC link buses 30a, 30b so as to produce an alternating current through the phase winding.

Figure 2:
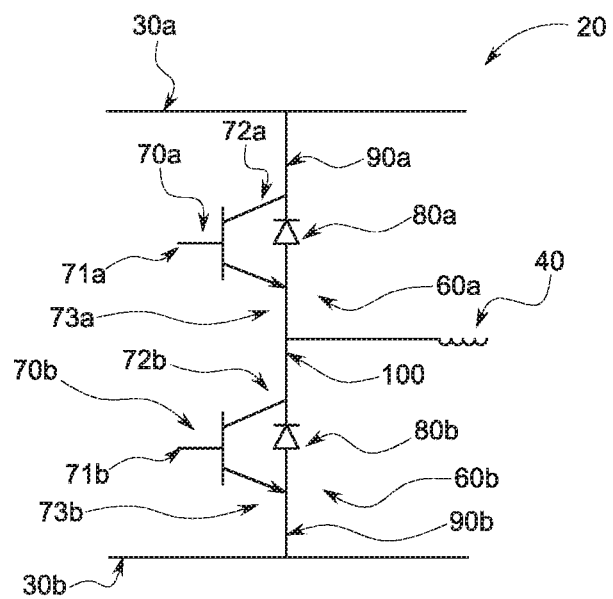

As shown schematically in FIG. 2, a switch package 60a, 60b includes a switch element 70a, 70b (e.g. MOSFET, IGBT, BJT, SiC transistor, or other semiconductor transistor or other semiconductor switch), respectively, as well as a flyback or freewheel element 80a, 80b (e.g., a diode connected anti-parallel to the switch element). In certain embodiments the switch element and the freewheel element can be combined into a single semiconductor structure, e.g. a BIGT. As shown in FIG. 2, each switch element 70a, 70b is supplied with gate voltage from a controller (not shown) via a gate lead 71a, 71b. As will be appreciated, in IGBTs as shown, application of gate voltage at the gate lead 71a, 71b enables current to flow from collector terminals 72a, 72b through the switch element to emitter terminals 73a, 73b. The high potential switch element 70a has supply terminals (e.g., collector terminal(s) 72a) that are connected by a first supply terminal connector 90a to the DC link high voltage bus 30a, and has load terminals (e.g., emitter terminal(s) 73a) that are connected by a load terminal connector 100 to the terminal(s) of the phase winding 40 and to load terminals (collector terminals 72b) of the low potential switch element 70b. The low potential switch element 70b has supply terminals (emitter terminals 73b) that are connected to the DC link low voltage bus 30b by a second supply terminal connector 90b. Together, the terminal connectors form a phase leg bus bar that connects the switch elements 70a, 70b of the phase leg 20 to the DC links 30a, 30b and to the phase winding 40. The supply terminal connectors 90a, 90b and the load terminal connector 100 are insulated from each other. For example, the bus bar may be a laminate assembly that includes plural conductive layers with intervening insulative layers.

As mentioned above, during normal operation of a power converter 10, the switch elements 70a, 70b of each phase leg 20 are controlled to commutate the DC link high and low buses 30*a*, 30*b* with the respective load terminal connector 100, and the commutations of the several phase legs 20 are timed to establish alternating current flow within the phase windings 40 that are connected between the several load terminal connectors 100. The switch elements 70*a*, 70*b* often are thermally and electrically anisotropic, i.e., not all of the collector terminal(s) 72*a*, 72*b* and emitter terminal(s) 73*a*, 73*b* are exposed to the same temperature environment as each other. Lack of isotropy among the switch element terminals can lead to non-uniform electrical conditions within the switch elements, which in turn detract from switching performance. For example, certain transients during commutation of a phase leg 20 can induce an ephemeral current from the DC link high voltage bus 30*a*, through the switch elements 70*a*, 70*b* and the terminal connector, to the DC link low voltage bus 30*b*. This ephemeral current imposes resistive, inductive, and capacitive losses within the terminal connectors.

Figure 3:
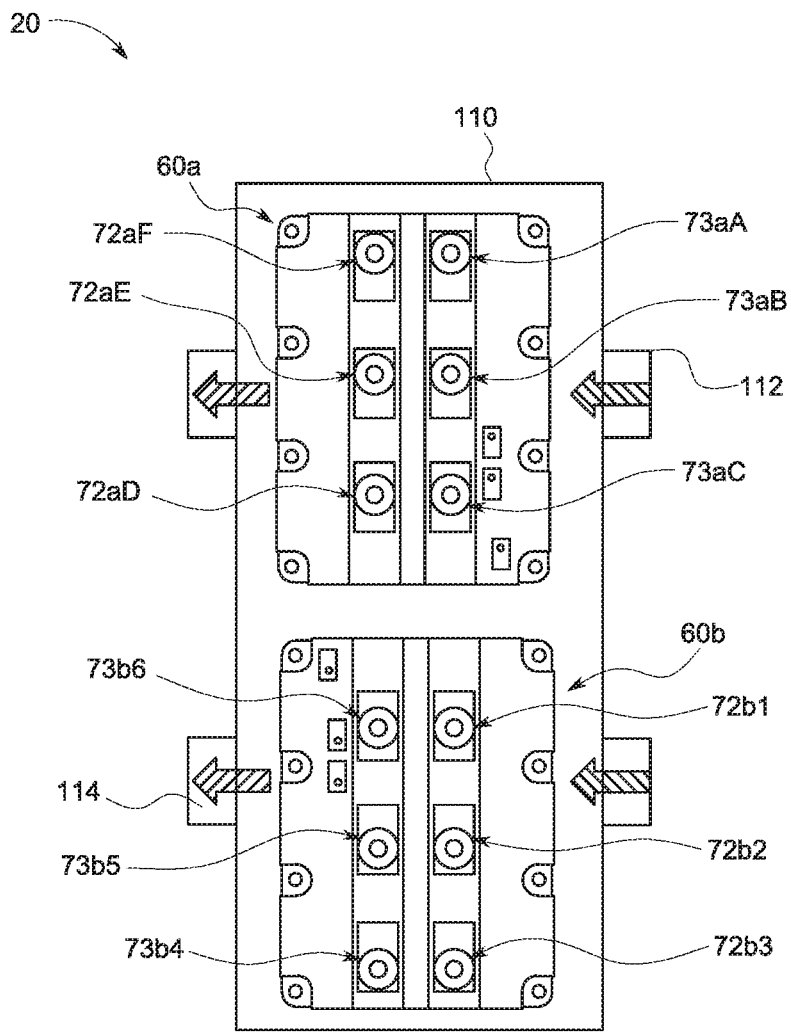
FIG. 3 shows in plan view a phase leg of a power converter, mounted on a heat sink, according to one aspect of the invention.

Certain aspects of the invention relate to arranging the high potential and low potential switch packages 60*a*, 60*b* on a heat sink 110, as shown in FIG. 3. In FIG. 3, the switch packages are arranged such that all load terminals, i.e., terminals connected to a motor or other load, such as the emitter terminals 73*a*A, 73*a*B, 73*a*C and the collector terminals 72*b*1, 72*b*2, 72*b*3, are adjacent to a coolant inlet side 112 where the coolant flow can maintain the load terminals at a first substantially same phase terminal temperature. The supply terminals, i.e., the terminals connected to the DC bus, such as collector terminals 72*a*D, 72*a*E, 72*a*F and the emitter terminals 73*b*4, 73*b*5, 73*b*6, are adjacent to a coolant outlet side having outlets 114 where the coolant flow can maintain the supply terminals at a second substantially same bus terminal temperature, which is slightly higher than the phase terminal temperature.

Figure 4:
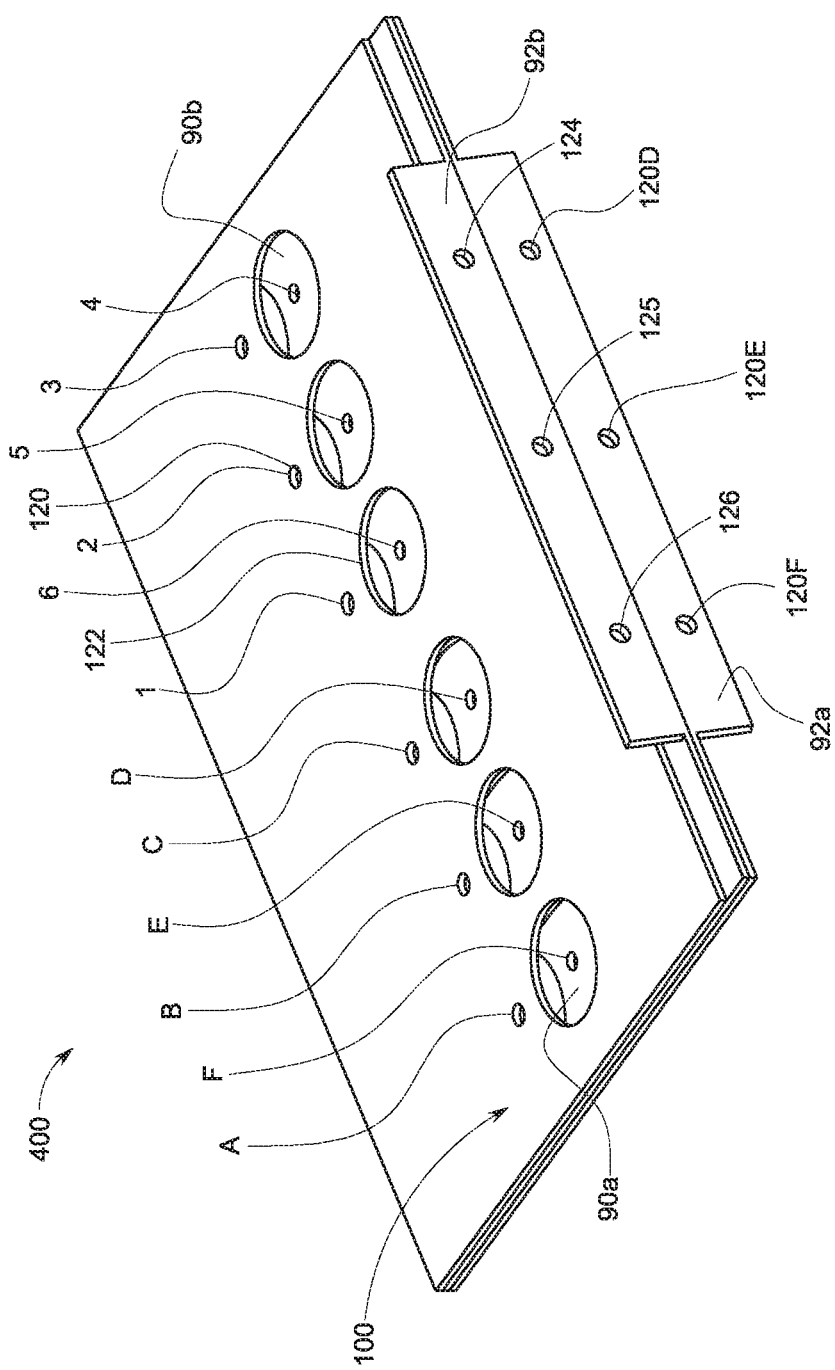
FIG. 4 shows in perspective view a bus bar comprised of three terminal connectors, for connection to the phase leg shown in FIG. 3.

With reference to FIG. 4, in an embodiment, a phase leg bus bar 400 includes conductive plates overlaid on an insulative substrate (not shown) with intervening insulative layers (not shown). Insulative layers typically are fabricated from materials that have a high dielectric breakdown voltage, are commercially available, inexpensive, easy to adhere using an adhesive, resistant to abrasion and accidental scratches, do not deteriorate with temperature and UV radiation, and thereby achieve a long life. Selected exemplary materials include: thin film polyesters (e.g., mylar, tedlar, kapton), cellular silicone foams, and celled polyurethane foams. The appropriate thickness of each insulative layer depends on system parameters such as, for example, the insulation voltage class, anticipated operating temperatures, and desirable partial discharge level. For example, a typical insulative layer may incorporate between about 300-500 µm insulation. The conductive plates provide a DC+ supply terminal connector 90*a*, a DC- supply terminal connector 90*b*, and a load terminal connector 100. Each conductive plate may be full rectangular in shape and is continuous in structure, with minimal features to permit electrical and/or mechanical connections through the insulative layer(s) and/or through other plates to the underlying semiconductor power switch. For example, the DC- supply terminal connector 90*b* has a tab 92*b* with pre-defined locations (e.g., holes) 124, 125, 126 for connecting to the DC low voltage bus 30*b*, and at its other edge has pre-defined locations (e.g., holes) 4, 5, 6 for connecting to emitter terminals 73*b*4, 73*b*5, 73*b*6 respectively. The DC+ supply terminal connector 90*a* has a tab 92*a* with pre-defined locations (e.g., holes) 120D, 120E, 120F for connecting to the DC high voltage bus 30*a*, and at its other edge has pre-defined locations (e.g., holes) D, E, F for connecting to collector terminals 72*a*D, 72*a*E, 72*a*F. Meanwhile, the load terminal connector 100 has a first plurality of pre-defined locations (e.g., holes) A, B, C for connecting respectively to the emitter terminals 73*a*A, 73*a*B, 73*a*C and has a second plurality of pre-defined locations (e.g., holes) 1, 2, 3 for connecting respectively to the collector terminals 72*b*1, 72*b*2, 72*b*3. Each of the plates also has larger clearance holes 122 for access to the pre-defined locations of the other plates. As should be appreciated, to reiterate, the terminal connector 100, DC- supply terminal connector 90*b*, and DC+ supply terminal connector 90*a* are electrically insulated from one another by intervening insulative layers, such that (for example) tab 92*a* and tab 92*b*, although shown as abutting in FIG. 4, are not electrically connected to one another.

In regards to material usage, the phase leg bus bar 400 as shown in FIG. 4 may be inefficient. For example, current typically does not flow in the portion of the load terminal connector 100 between the tabs 92*a*, 92*b* and the holes 122 nor in the portions of the supply terminal connectors distal from the tabs 92*a*, 92*b* beyond the holes 120. To the extent that current occurs in these "dead" plate regions, it is more likely eddy current induced by electron flow in adjacent plates. The phase leg bus bar 400 may also be relatively electrically inefficient. For example, during commutation transients, the ephemeral current flows predominantly among the four inner terminals 1, 6, C, D, somewhat among the next inner terminals 2, 5, B, E, and negligibly among the four outer terminals 3, 4, A, F. The non-uniform current distribution produces uneven heating by inductive and resistive losses, which, in turn, exacerbates the discrepancies in resistance among the various conductive pathways so that current crowding may emerge among the innermost terminals.

Accordingly, embodiments of the invention seek to reduce material waste by re-shaping the supply terminal connectors 90*a*, 90*b* and the load terminal connector 100 in order to balance impedances and optimize mutual inductances among their respective terminals (1, 2, 3, A, B, C of the load terminal connector 100; 4, 5, 6, 124, 125, 126 of the DC- supply terminal connector 90*b*; D, E, F, 120D, 120E, 120F of the DC+ supply terminal connector 90*a*). With reference to FIGS. 5-14, other aspects of the invention relate to modifying shapes of supply terminal connectors and load terminal connectors so as to provide bus bars with discrete or substantially discrete current paths between selected pairs of terminals. For example, in certain embodiments, a bus bar (e.g., phase leg bus bar) includes an even number of laminations at each set of switch terminals. The use of paired laminations arises from an observation that currents follow the lowest impedance paths and influence the stray inductance behavior according to their layout. If adjacent currents are oppositely directed by the conductive geometry, favorable mutual inductance contributes to cancelling overall stray magnetic fields and diminishing inductive losses.

In embodiments, for all terminals connecting to a same voltage source, each terminal may be connected in a current path of the same impedance, sum of the contribution of the resistance and the inductance, including AC effects like proximity. Generally, embodiments of the invention advantageously provide that switch terminals are substantially electrically and thermally balanced in load, that is, all of the switch terminals see substantially the same current flow and substantially the same thermal environment, and, therefore, exhibit substantially the same power losses.

Therefore, bus bars according to embodiments of the invention (e.g., phase leg bus bars) can mitigate losses imposed by the ephemeral current under design current injection transient conditions, thereby reducing switching heat loss. Additionally, by substantially balancing the currents among the terminals, switch response time and uniformity may be improved, i.e., eliminating or substantially eliminating current loops among switch terminals.

Thus, according to aspects of the invention, "smart" shaping of supply terminal connectors and load terminal connectors assures that during a design commutation transient the ephemeral current within a phase leg bus bar is substantially balanced between corresponding terminals and is directed in such a way that negative mutual inductance is maximized, that is, stray magnetic fields are minimized. Additionally, switch response is improved by establishing substantially the same electrical and/or thermal conditions at each terminal of a switch.

Figures 5, 6:
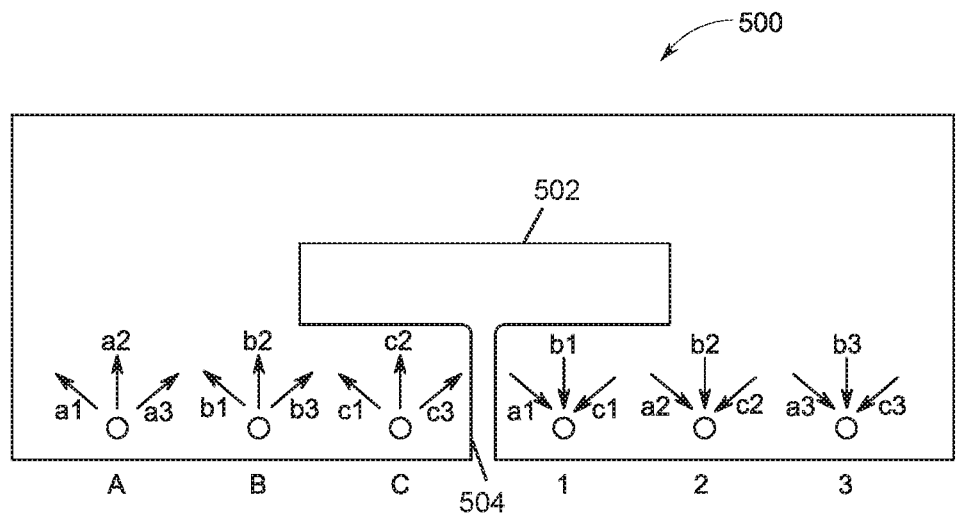
FIG. 5 shows in plan view a load terminal connector according to an embodiment of the invention.
FIG. 6 shows a matrix used in developing embodiments of the invention.

In this regard, FIG. 5 shows an exemplary terminal connector 500 that includes a "gap" formed, in this example, by a window 502 and a slot 504. As used herein, a "gap" refers to, for example, a window, slot, layer separation, region of reduced material thickness, or other structure, along or in combination, that presents significantly higher resistance than surrounding structure. "Significantly higher resistance" means a difference in conductivity sufficiently large such that all or substantially all current avoids the gap structure.

Referring to FIG. 5, the terminal connector 500 is marked with indicia corresponding to its various terminals and conductive pathways among those terminals, while FIG. 6 shows a matrix of mutual resistances and inductances among the terminals labeled according to the indicia shown in FIG. 5. The indicia A, B, C correspond to a plurality of first pre-defined locations on the terminal connector 500, while the indicia 1, 2, 3 correspond to a plurality of second pre-defined locations on the terminal connector 500. The window 502 and the slot 504 separate the first pre-defined locations from the second pre-defined locations, and constrain current flow among the pluralities of pre-defined locations such that each of the pre-defined locations is substantially electrically balanced with each other of the pre-defined locations.

As used herein, the terms "substantially," "generally," and "about" indicate conditions within reasonably achievable manufacturing and assembly tolerances, relative to ideal desired conditions suitable for achieving the functional purpose of a component or assembly. "Substantially balanced" or "substantially electrically balanced" specifically refers to a condition in which electrical and/or thermal values among a plurality of conductive paths, between common terminals, remain within plus or minus 10% variation. "Balanced," on the other hand, implies a narrower range of plus or minus 3% variation.

Referring specifically to thermal variations, as used herein, a set of terminals of a power electronic device mounted on a heat sink may be described as "substantially thermally equidistant" with each other from the coolant, wherein all of the set of terminals have about the same temperature difference (plus or minus 10%) from the coolant inlet temperature during operation. Moreover, they may be described as "thermally equidistant" from the coolant in case all of the set of terminals have the same temperature difference (plus or minus 3%) from the coolant inlet temperature. On the other hand, the terminals may be described as "substantially thermally balanced" with each other in embodiments where each of the terminals exhibits substantially a same thermal power dissipation (plus or minus 10%) as each other of the terminals, and may be described as "thermally balanced" with each other in embodiments where each of the terminals exhibits a same thermal power dissipation (plus or minus 3%) as each other of the terminals.

Similarly, the terminals may be described as substantially electrically balanced in embodiments where each of the terminals carries substantially (plus or minus 10%) a same current as each other of the terminals, or electrically balanced in case each of the terminals carries a same current, plus or minus 3%, as each other of the terminals.

By defining the current pathways between among the plural terminals, resistance and inductance circuit parameters can be controlled to convenient values that provide electrical balance across the terminal connectors among the terminals. In embodiments, current paths are shaped, especially during commutation transients, so that switching device terminals are electrically and thermally balanced.

It will be understood that aspects of the invention involve impedance matching and operating power dissipation, so that a particular arrangement of terminals or of conductive pathways may be described as balanced or substantially balanced with reference to a particular designed range of operating parameters. Similarly, a particular arrangement of electrical terminals may be described as thermally equidistant or substantially thermally equidistant from a reference substance (e.g., coolant) or location, with reference to the same particular designed range of operating parameters.

For example, under certain operating parameters by which one of a pair of power electronic devices sees a significantly higher duty cycle than the other of the pair of power electronic devices, then a particular layout of those power electronic devices on a heat sink might be required in order to render bus terminals of the high-duty-cycle device and of the low-duty-cycle device thermally equidistant from the coolant in the heat sink.

Turning now to the matrix depicted in FIG. 6, the values of resistance and inductance are calculated based on a design commutation transient, in light of such parameters as switching frequency, pulse duration, gate voltage ramp rate, and plate dimensions. Certain parameters are designated as fixed parameters (e.g., switching frequency, pulse duration) while others (e.g., turn on/turn off current and/or voltage ramps, plate dimensions, presence or absence of windows in plates) may be designated as variant parameters. Although skin effect is not a concern during steady state operation, for high-frequency transients it may be considered.

In order to converge to an acceptable set of design candidates (a set of candidates in which each candidate provides for substantial electrical and thermal balance among pre-defined locations), the resistance and inductance matrices are normalized, and the variant parameters are repeatedly varied to obtain a plurality of candidate configurations. In an embodiment, for each candidate configuration, a Euclidean norm is calculated. For example, for the matrix of inductances, a norm is calculated according to the formula $$\|\Delta L\|_p = (\Sigma |\Delta L_{ij}|^p)^{1/p}$$

The candidate matrix with lowest Euclidean norm then is selected as the closest to a balanced situation. This design approach can be automated and iterated using, e.g., a genetic algorithm, in order to obtain a "current shaping" terminal connector in which the gap or gaps are shaped to obtain substantially balanced electrical and thermal conditions.

Figure 7:
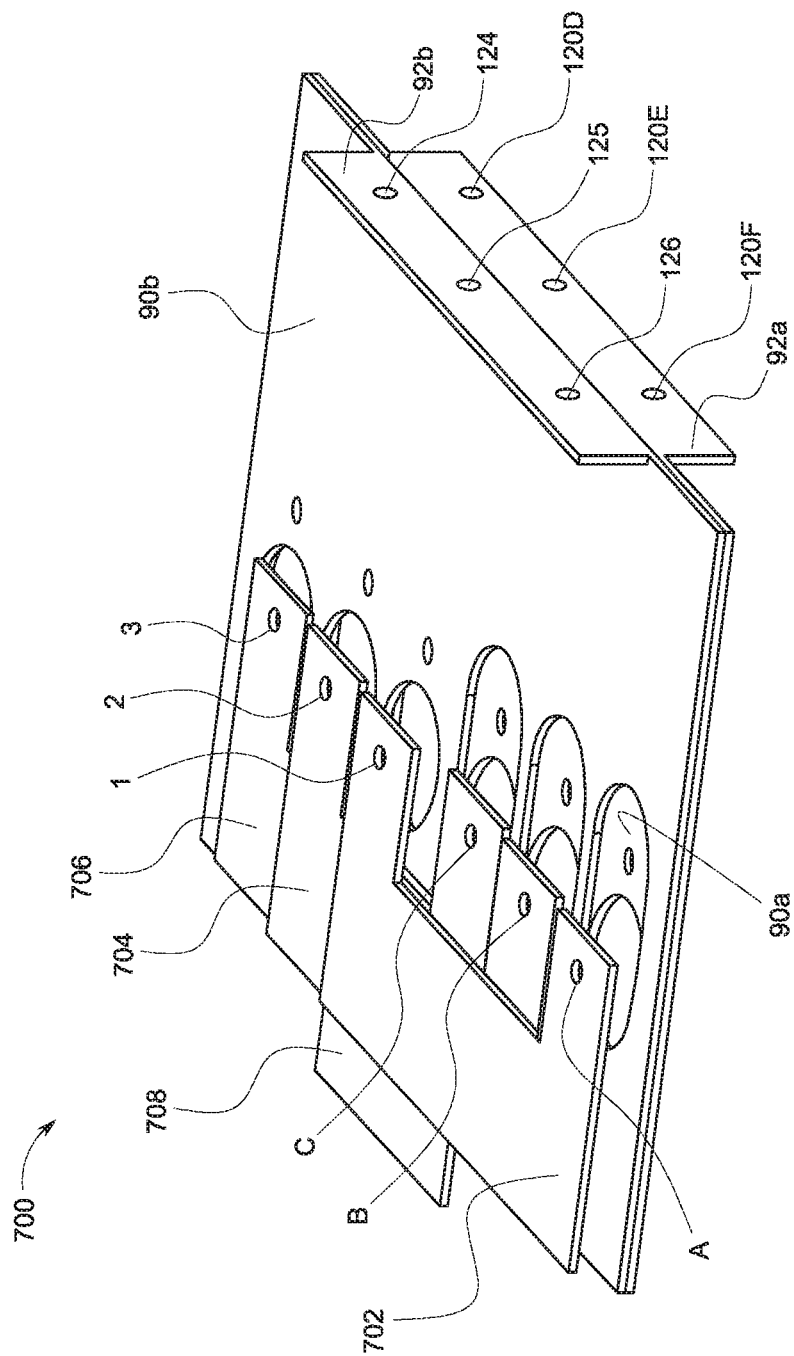
FIG. 7 shows in perspective view a bus bar according to a first embodiment of the invention.

FIG. 7 illustrates an embodiment of a bus bar that includes a load terminal connector 700 that overlaps the supply terminal connectors 90a, 90b, which are provided for connection to a DC link. The load terminal connector 700 is a current shaping terminal connector, comprised of wing layers 702, 706 and a central layer 704 that is sandwiched between the wing layers. The left or upper wing layer 702 includes holes A and 1 for connection to terminals 73aA and 72b1 as shown in FIG. 3. The central layer 704 includes holes B and 2 for connection to terminals 73aB and 72b2 as shown in FIG. 3. The lower or right wing layer 706 includes holes C and 3 for connection to terminals 73aC and 72b3 as shown in FIG. 3. The three layers 702, 704, 706 provide discrete conductive pathways among pairs of the terminals A, B, C, 1, 2, 3, such that each of the pathways is of substantially equal impedance to the others. Presuming substantially identical voltage transients across each of the paired terminals, then substantially equal currents will flow through each of the terminals A, B, C or 1, 2, 3 along the three discrete conductive pathways.

In this sense the three layers 702, 704, 706 may be said to provide discrete and substantially balanced conductive pathways amongst the one or more pre-defined first locations A, B, C and the plurality of pre-defined second locations 1, 2, 3. All three layers of the load terminal connector 700 overlap to form a projecting tab 708 that includes pre-defined load locations for connection of load leads (not shown) to a winding or other load (not shown in this view). Such a projecting tab may be provided at various locations on a load terminal connector, and although not specifically shown, may be provided in each embodiment of the bus bar as shown in the various figures herein. On the other hand, certain embodiments may have load leads directly connected at the plane of a load terminal connector, without a projecting tab.

During commutation transients, a magnetic field induced from the ephemeral current through the upper wing layer 702 partially cancels magnetic fields induced from the ephemeral current through the central layer 704 and the lower wing layer 706. At all times, the provision of discrete layers for each pair of terminals, all three of the discrete layers having conductive paths of substantially equal length, enhances conduction and reduces resistive losses within the load terminal connector 700. Collectively, the three layers 702, 704, 706 provide substantially balanced conductive paths among the six terminals A, B, C, 1, 2, 3.

According to an aspect, the wing layers and/or the central layer may be generally elongated U-shaped, with the layer comprising a conductive sheet (e.g., metal sheet) having a main portion with first and second ends, a first tab or wing protruding from the main portion at the first end, and a second tab or wing protruding from the second end. The first and second tabs include respective locations (e.g., holes) for attachment of a device or devices. The tabs protrude in a common direction, such that in a straight line between the locations (e.g., holes) on the tabs, there is an area where there is no conductive material of the sheet, or at least there is a gap such that no or substantially no current can flow in a straight line directly between the locations (e.g., holes).

Figure 8:
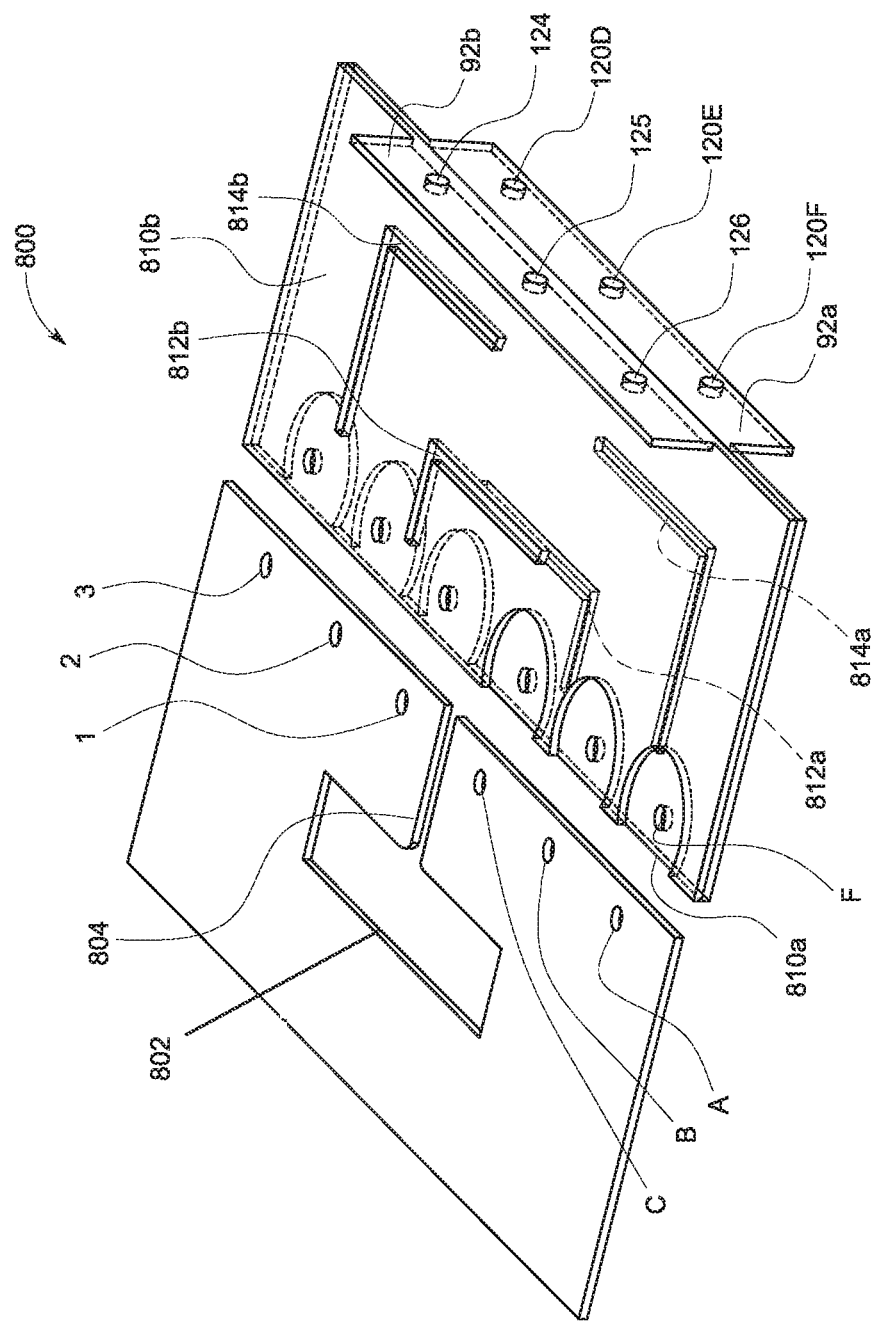
FIG. 8 shows in perspective view a bus bar according to a second embodiment of the invention.

FIG. 8 illustrates a second embodiment of a bus bar, which includes a load terminal connector 800 in combination with supply terminal connectors 810a, 810b. The load terminal connector 800 does not overlap the supply terminal connectors 810a, 810b. The load terminal connector 800 includes a central opening or window 802 from which a slot 804 extends to the edge of the phase plate. The window 802 and the slot 804 divide one or more pre-defined first locations (holes) A, B, C (for connection with the high potential switch package emitter terminals 73a) from a plurality of pre-defined second locations 1, 2, 3 (for connection with the low potential switch package collector terminals 72b).

The window 802 and the slot 804 are arranged to optimize the mutual resistance and inductance as described by the matrix equations shown in FIG. 6. In particular, to provide substantially balanced conductive paths among the first locations A, B, C and the second locations 1, 2, 3 such that substantially equal first currents flow through each of the first locations A, B, C and substantially equal second currents flow through each of the second locations 1, 2, 3.

It will be appreciated that, although equal numbers of first and second locations are shown (and, therefore, the magnitudes of the substantially equal first currents are substantially equal to the magnitudes of the substantially equal second currents), in other embodiments a quantity of first locations may differ from a quantity of second locations. In other words, there may be fewer or more first locations than second locations. In such other embodiments (not shown), aspects of the invention provide that the shape of the plate could be adjusted to provide for substantially equal first currents at each of the one or more first locations, and substantially equal second currents at each of the one or more second locations.

Still referring to FIG. 8, the supply terminal connectors 810a, 810b include L-slots 812a, 812b, 814a, 814b that define substantially discrete and substantially balanced conductive paths from each one of the switch terminal connectors (first locations) D, E, F or 4, 5, 6 to a corresponding one of the tab holes (second locations) 120D, 120E, 120F or 124, 125, 126, respectively. For example, the L-slot 814a separates two substantially discrete conductive paths: a path from one of the first locations (hole F) on supply terminal connector 810a, to one of the second locations (hole 120F) on tab 92a; and another path from another of the first locations (hole E) on supply terminal connector 810a, to another of the second locations (hole 120E) on tab 92a. These two substantially discrete conductive paths are substantially balanced with a third substantially discrete conductive path defined by the slot 816a from another of the first locations (hole D) to another of the second locations (hole 120D). Thus, substantially equal first currents flow through the first locations D, E, F and substantially equal second currents flow through the second locations 120D, 120E, 120F. (As should be appreciated, each L-slot is a gap formed in the sheet of the connector 810a, 810b, which includes a first elongate gap portion with a first end and a second end, and a second elongate gap portion with a first end and a second end, the first end of the second elongate gap portion located at the second end of the first elongate gap portion and oriented perpendicular thereto. The elongate gap portions may have different lengths.)

Also, the two supply terminal connectors 810a, 810b are matching inverts of each other, in other words, plate 810a can be flipped over to become plate 810b. The two plates are overlaid adjacent an intervening insulative layer. The same is true for several other embodiments as described and illustrated following. Accordingly, in such embodiments the discrete conductive paths on the two supply terminal connectors generally are anti-parallel at their overlapping portions, e.g., during a commutation transient the current from hole 6 on plate 810b to hole 126 on tab 92b flows generally opposite direction to the current from hole D on plate 810a to hole 120D on tab 92a. Typically, these anti-parallel currents are substantially equal such that their mutual inductance cancels out.

The supply terminal connectors 810a, 810b and the load terminal connector 800 may be affixed to a common underlying planar insulative or other support, however, such a support is not shown in FIG. 8 for clarity of illustration.

Figure 9:
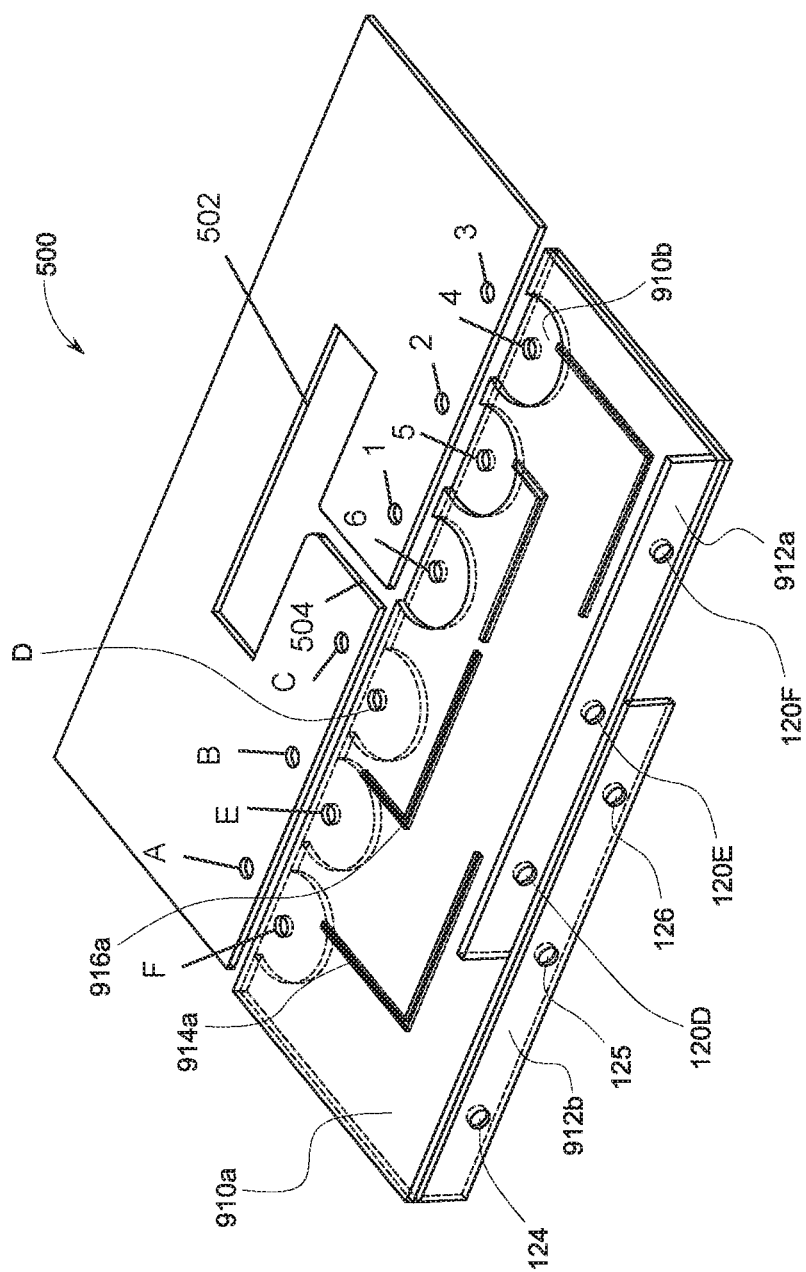
FIG. 9 shows in perspective view a bus bar according to a third embodiment of the invention.

FIG. 9 shows a third embodiment of a bus bar, which includes a similar load terminal connector 500 as shown in FIG. 5 in combination with supply terminal connectors 910a, 910b that have offset tabs 912a, 912b. The load terminal connector 500 includes a central window 502 and an open slot 504, which together impose substantially balanced conductive pathways among the plurality of pre-defined first locations A, B, C and the plurality of pre-defined second locations 1, 2, 3. The supply terminal connectors 910a, 910b include L-slots 914a, 916a, etc. that define substantially discrete conductive paths among pairs of terminal connecting holes (first locations D, E, F or 4, 5, 6 and second locations 120D, 120E, 120F or 124, 125, 126). For example, the L-slot 916a defines a substantially discrete conductive path from the hole (first location) D on supply terminal connector 910a to the hole (second location) 120D on offset tab 912a.

As in FIG. 8, the L-slots 914a, 916a, etc. define discrete conductive paths on the two plates 910a, 910b that generally are anti-parallel at their overlapping portions. The offset tabs 912a, 912b enhance the opposition of the overlapping current paths across the plates 910a, 910b. Accordingly, in this and similar embodiments, the supply terminal connectors are arranged such that a magnetic field induced by current in a conductive pathway in one of the supply terminal connectors is substantially canceled (e.g., reduced to less than about 10% of what it otherwise would be) by a magnetic field induced by current in a corresponding conductive pathway in the other of the supply terminal connectors.

Figure 10:
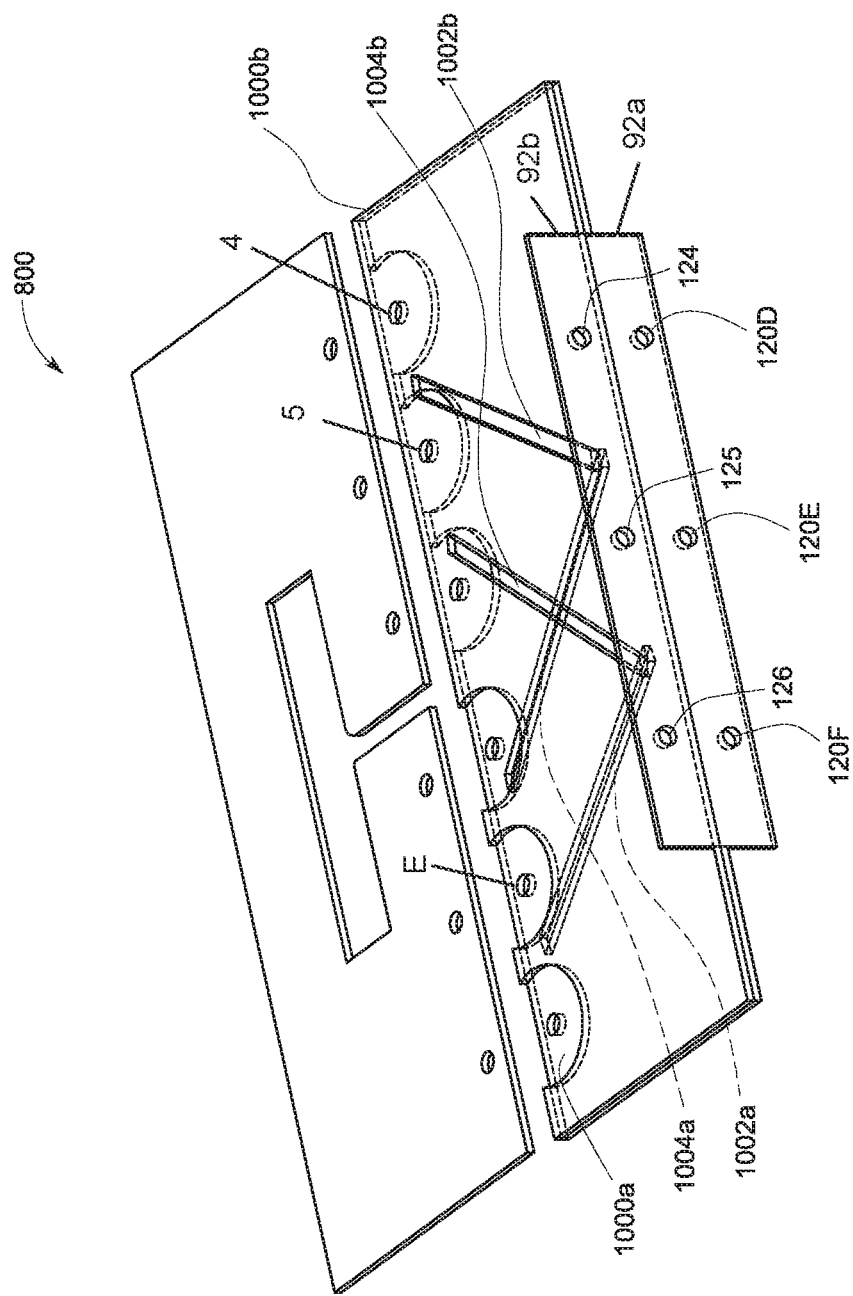
FIG. 10 shows in perspective view a bus bar according to a fourth embodiment of the invention.

FIG. 10 shows a fourth embodiment of a bus bar, which includes the same load terminal connector 800 as shown in FIG. 8, in combination with supply terminal connectors 1000a, 1000b that have central tabs 92a, 92b and V-slots 1002a, 1002b, 1004a, 1004b. The V-slots 1002a, 1002b, 1004a, 1004b define substantially discrete conductive paths among pairs of first and second locations (terminal connecting holes), e.g., the V-slot 1002b defines a path from the hole 4 on supply terminal connector 1000b to the hole 124 on tab 92b. The discrete current paths generally are orthogonal at their overlapping portions, e.g., during a commutation transient the current from hole 5 on plate 1000b to hole 125 on tab 92b flows generally orthogonal to the current from hole E on plate 1000a to hole 120E on tab 92a.

Figure 11:
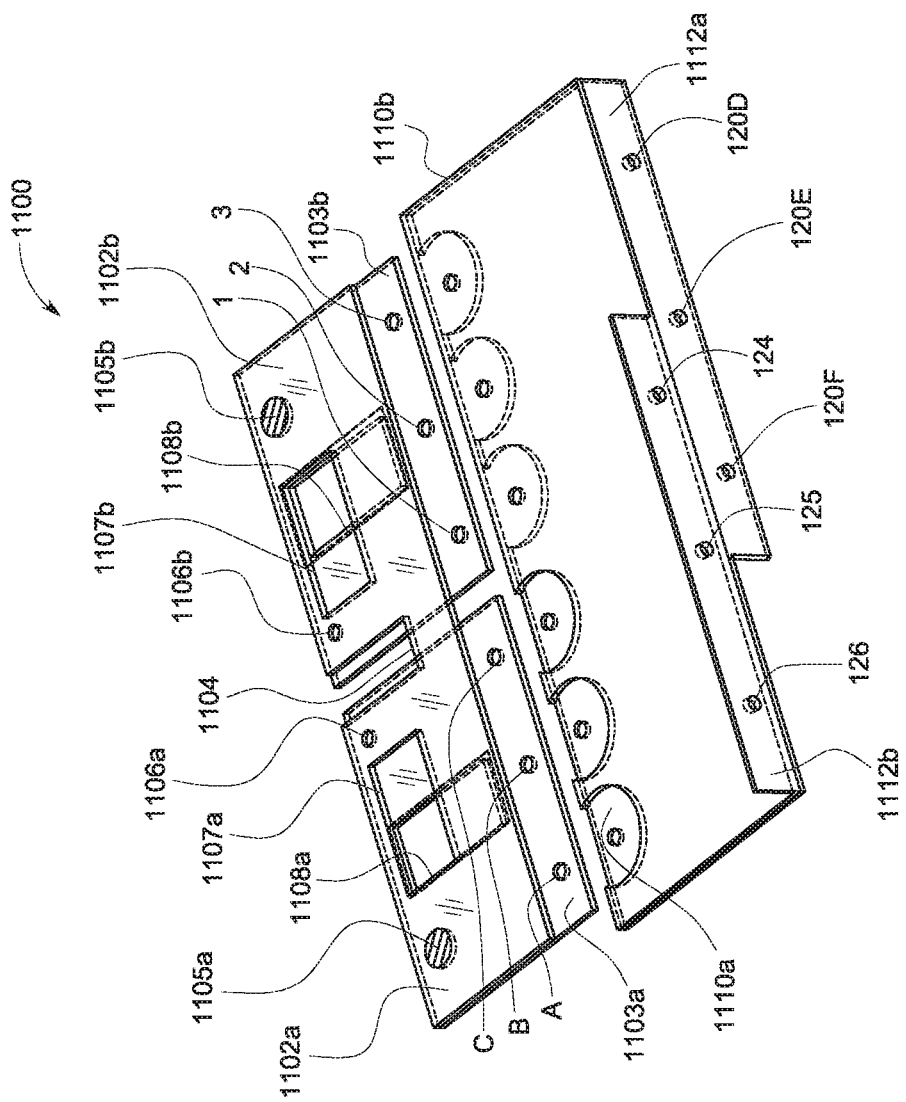
FIG. 11 shows in perspective view a bus bar according to a fifth embodiment of the invention.

FIG. 11 shows a fifth embodiment of a bus bar, which includes a load terminal connector 1100 that includes a windowed bridge plate with wings 1102a, 1102b, which is overlaid on windowed islands 1103a, 1103b. The wings 1102a, 1102b are connected via a bridge 1104. Thus, the bridge provides for current in the overlaid wings 1102a, 1102b to flow substantially opposite to current in the islands 1103a, 1103b, so that there are reversing conductive pathways in the overlaid layers. The load terminal connector 1100 is used in combination with a pair of supply terminal connectors 1110a, 1110b that have offset tabs 1112a, 1112b without any sort of slotting in the supply terminal connectors. Referring to the bridge plate, each wing 1102a or 1102b is connected to its underlying island 1103a or 1103b by vias or hot spots 1105a, 1105b, 1106a, 1106b pierced through an insulative layer (not shown). The hot spots 1105a, 1105b, 1106a, 1106b may be of differing size, and cooperate with the windows 1107a, 1107b in each wing 1102a, 1102b and the windows 1108a, 1108b in each island 1103a, 1103b in order to establish substantially anti-parallel current paths (reversing conductive pathways) of substantially equal resistance through the islands and their overlaying bridge wings. For example, a current path from hole A to hole 1 (through island 1103a, hot spots 1105a, 1106a, bridge wing 1102a, bridge 1104, bridge wing 1102b, hot spots 1106b, 1105b, and island 1103b) exhibits substantially the same resistance and inductance as a current path from hole 2 to hole B (through the same features). Meanwhile, during commutation transients the offset tabs 1112a, 1112b suffice to establish generally orthogonal paths for the ephemeral current through the supply terminal connectors 1110a, 1110b.

Figure 12:
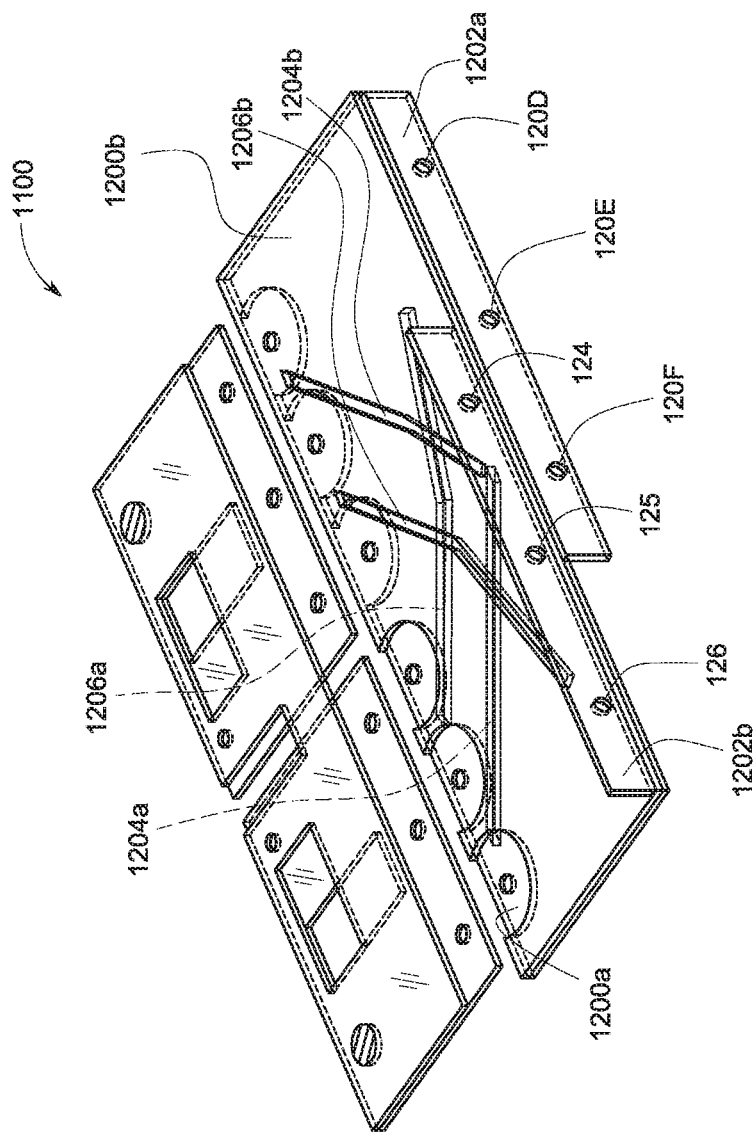
FIG. 12 shows in perspective view a bus bar according to a sixth embodiment of the invention.

A sixth embodiment of a bus bar is shown in FIG. 12, wherein the load terminal connector 1100 is combined with supply terminal connectors 1200a, 1200b that incorporate offset tabs 1202a, 1202b along with W-slots 1204a, 1204b, 1206a, 1206b. The W-slots 1204a, 1204b, 1206a, 1206b define discrete conductive paths such that overlaying paths vary from substantially orthogonal near the holes F, E, D, 6, 5, 4 (not numbered in FIG. 12, but the same arrangement as in FIG. 9) to substantially anti-parallel near the tab holes 126, 125, 124, 120F, 120E, 120D.

Figure 13:
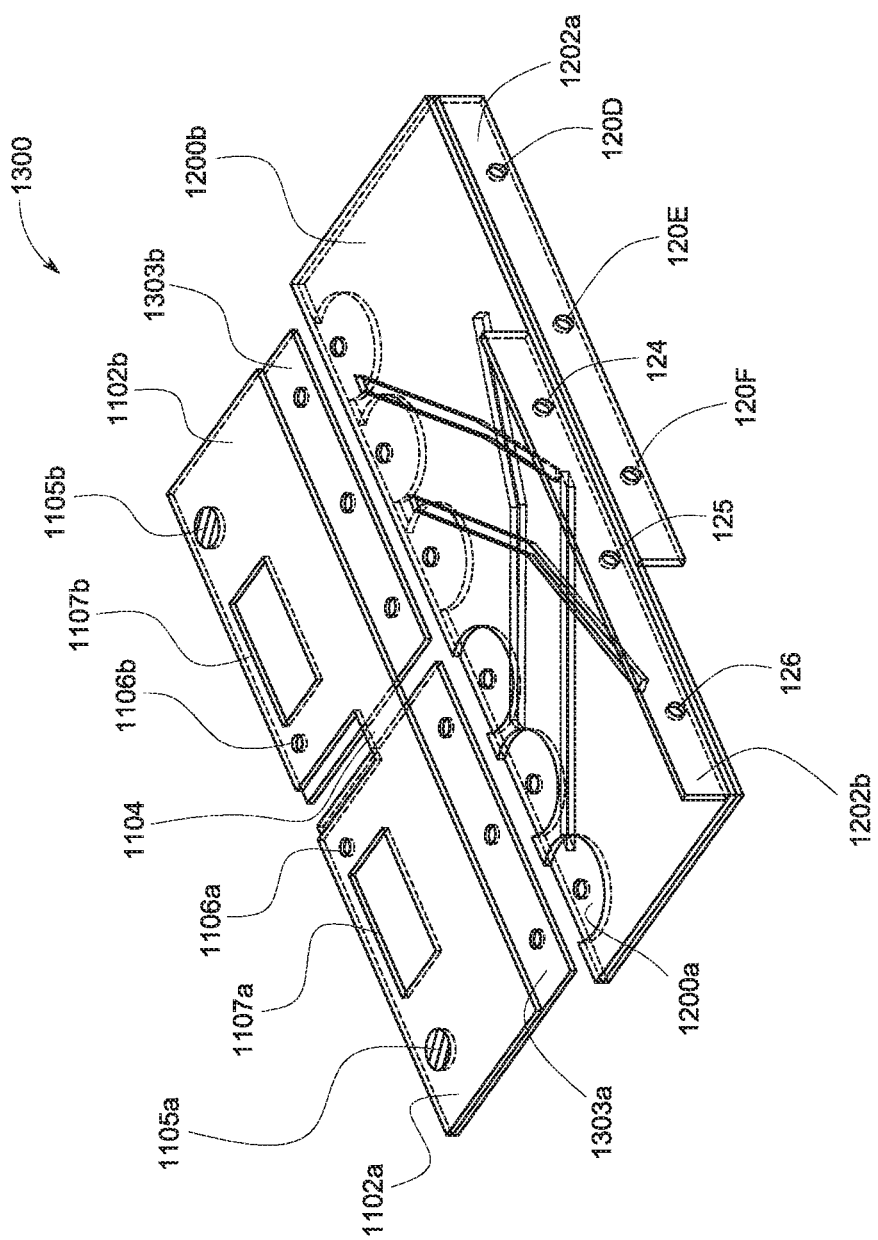
FIG. 13 shows in perspective view a bus bar according to a seventh embodiment of the invention.

FIG. 13 shows a seventh embodiment of a bus bar, in which a load terminal connector 1300 uses the windowed bridge plate 1102a, 1102b to connect non-windowed islands 1303a, 1303b. The load terminal connector 1300 is combined with supply terminal connectors 1200a, 1200b that have offset tabs 1202a, 1202b and W-slots 1204, 1206, substantially as shown in FIG. 12.

Figure 14:
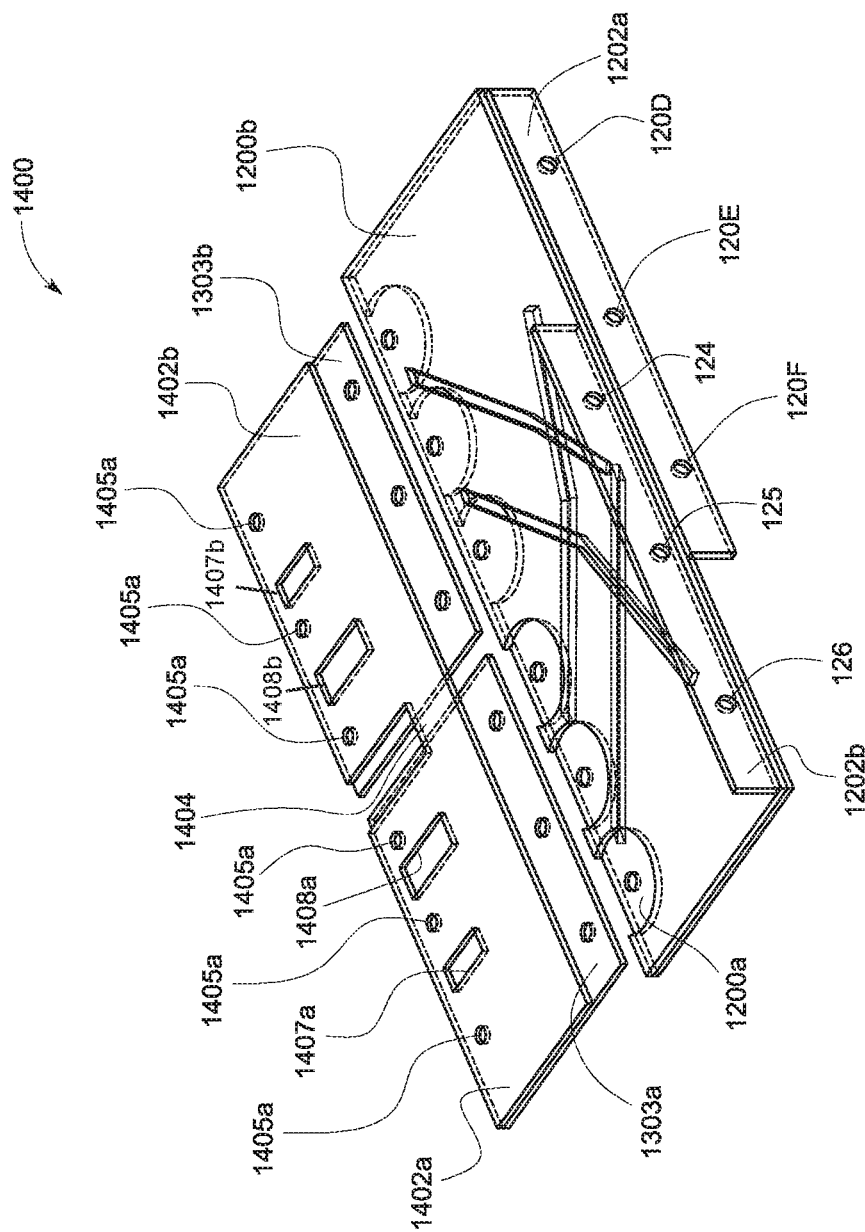
FIG. 14 shows in perspective view a bus bar according to an eighth embodiment of the invention.

FIG. 14 shows an eighth embodiment of a bus bar, wherein the supply terminal connectors 1200a, 1200b are combined with a load terminal connector 1400 that uses doubly-windowed bridge wings 1402a, 1402b and a bridge 1404 to connect non-windowed islands 1303a, 1303b. In this case the windows 1407a, 1407b, 1408a, 1408b formed in the bridge wings 1402a, 1402b constrain the ephemeral current within the bridge wings to induce substantially anti-parallel current paths in the underlying islands 1303a, 1303b.

Thus, embodiments of the invention provide a current shaping phase leg bus bar for power electronics systems, which includes a first terminal connector; a second terminal connector, insulated from the first terminal connector; and a third terminal connector, insulated from the first and second terminal connectors. At least one of the terminal connectors is a current shaping terminal connector that includes one or more layers having a plurality of pre-defined locations for electrical connections. The plurality of pre-defined locations include one or more first locations and a plurality of second locations. The current shaping terminal connector also includes one or more gaps within or among its one or more layers, to provide substantially balanced conductive pathways among its one or more first locations and its plurality of second locations. In certain embodiments, at least two of the terminal connectors are current shaping terminal connectors that are configured to provide substantially balanced conductive pathways among their respective first locations and second locations. For example, two of the terminal connectors may be matching inverts of each other. In case two terminal connectors are matching inverts, they may be overlaid adjacent an intervening insulative layer. In certain embodiments, the terminal connectors are arranged such that a magnetic field induced by current in a conductive pathway in one of the at least two terminal connectors is substantially canceled by a magnetic field induced by current in a corresponding conductive pathway in the other of the at least two terminal connectors. In certain embodiments, the current shaping terminal connector comprises an even number of layers overlaid to provide reversing conductive pathways. For example, the current shaping terminal connector comprises a bridge layer overlaying and substantially insulated from an island layer, the bridge layer has lateral wings conductively joined by a central bridge, the island layer has lateral islands that are not conductively joined within the island layer, each lateral island of the island layer includes either at least one first location or at least one second location, and is conductively joined by at least one hot spot to an overlying lateral wing of the bridge layer, gaps are formed in the islands and wings to define substantially discrete conductive pathways from each of the one or more first locations to a corresponding one of the second locations, each of the substantially discrete conductive pathways includes the central bridge, and each of the substantially discrete conductive pathways includes a portion in the bridge layer that overlies in anti-parallel fashion a portion of that same conductive pathway in the island layer. In certain embodiments, the current shaping terminal connector includes at least one window. In certain embodiments, the current shaping terminal connector includes substantially discrete conductive pathways amongst the one or more first locations and the plurality of second locations. In certain embodiments, at least one of the gaps is a region of reduced material thickness.

Other embodiments provide a power electronic device, which has a heat sink that has a coolant inlet and a coolant outlet, first and second switch packages, each package having supply terminals and load terminals, the supply terminals of the first and second switch packages are substantially thermally equidistant from the coolant inlet at a first thermal distance and the load terminals of the first and second switch packages are substantially thermally equidistant from the coolant inlet at a second thermal distance that is less than the first thermal distance; and at least one current shaping terminal connector connecting the load terminals of the first and second switch packages, the current shaping terminal connector including one or more layers having a plurality of pre-defined locations for electrical connections, said plurality of pre-defined locations including one or more first locations and a plurality of second locations, and including one or more gaps within or among its one or more layers, to provide substantially balanced conductive pathways among its one or more first locations and its plurality of second locations. In certain embodiments, at least one of the gaps is a region of reduced material thickness. In certain embodiments, the at least one current shaping terminal connector comprises an even number of layers overlaid to provide reversing conductive pathways. For example, the at least one current shaping terminal connector comprises a bridge layer overlaying and insulated from an island layer, the bridge layer has lateral wings conductively joined by a central bridge, the island layer has lateral islands that are not conductively joined within the island layer, each lateral island of the island layer includes either at least one first location or at least one second location, and is conductively joined by at least one hot spot to an overlying lateral wing of the bridge layer, gaps are formed in the islands and wings to define substantially discrete conductive pathways from each of the one or more first locations to a corresponding one of the second locations, each of the substantially discrete conductive pathways includes the central bridge, and each of the substantially discrete conductive pathways includes a portion in the bridge layer that overlies in anti-parallel fashion a portion of that same conductive pathway in the island layer. Each wing of the bridge layer, and/or each island of the island layer, may include at least one window. In certain embodiments, the at least one current shaping terminal connector includes substantially discrete conductive pathways amongst the one or more first locations and the plurality of second locations. In some embodiments, the at least one current shaping terminal connector has its first locations aligned substantially along a first line defined by the load terminals of the first switch package, and has its second locations aligned substantially along the same line connected with the load terminals of the second switch package, with the first locations of equal number as the second locations, and the at least one current shaping terminal connector includes gaps defining substantially discrete conductive paths connecting pairs of the first and second locations. In some embodiments, the power electronic device also includes second and third current shaping terminal connectors respectively connected to the supply terminals of the first switch package and to the supply terminals of the second switch package, and the second and third current shaping terminals connectors are matching inverts of each other. In such embodiments, the second and third current shaping terminal connectors may be arranged such that a magnetic field induced by current in a conductive pathway in one of the terminal connectors is substantially canceled by a magnetic field induced by current in a corresponding conductive pathway in the other of the terminal connectors.

Aspects of the invention provide a method of making a current shaping terminal connector, which includes forming at least one conductive plate; forming on the at least one conductive plate a plurality of pre-defined locations, including at least one first location and a plurality of second locations; and forming in or about the conductive plate at least one gap that is configured to impose substantially balanced electrical pathways among the at least one first location and the plurality of second locations.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. In the appended clauses, the terms "including" and "in which" are used as the plain-English equivalents of the respective terms "comprising" and "wherein." Moreover, in the following clauses, terms such as "first," "second," "third," "upper," "lower," "bottom," "top," etc. are used merely as labels, and are not intended to impose numerical or positional requirements on their objects. Further, the limitations of the following clauses are not written in means-plus-function format and are not intended to be interpreted based on 35 U.S.C. § 112, sixth paragraph, unless and until such clause limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the subject matter described above, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A bus bar comprising:
    a terminal connector comprising:
        a first U-shaped wing layer;
        a Y-shaped wing layer that is separate from the first U-shaped wing layer; and
        a second U-shaped wing layer that is separate from the first U-shaped wing layer and the Y-shaped wing layer;
    wherein the terminal connector is a current shaping terminal connector, the Y-shaped wing layer is sandwiched between the first U-shaped layer and the second U-shaped wing layer, each of the first U-shaped wing layer, Y-shaped wing layer, and the second U-shaped wing layer including plural elongated ends having a connector hole in each of the elongated ends for electrical connections,
    wherein the first U-shaped wing layer, the Y-shaped wing layer, and the second U-shaped wing layer overlap each other, the Y-shaped wing layer including a projecting tab having a pre-defined load location and extending from the Y-shaped wing layer in a direction that is located between and oriented opposite of directions in which the elongated ends that the Y-shaped wing layer are elongated, wherein the first U-shaped wing layer and the second U-shaped wing layer do not have the projecting tab extending in the direction that is between and oriented opposite of the directions in which the elongated ends that the first U-shaped wing layer and the second U-shaped wing layer are elongated.

2. The bus bar of claim 1, wherein the terminal connector is configured to provide substantially balanced conductive pathways via the first U-shaped wing layer, the Y-shaped wing layer, and the second U-shaped wing layer.

3. The bus bar of claim 1, wherein the first U-shaped wing layer, the Y-shaped wing layer, and the second U-shaped wing layer are arranged such that a magnetic field induced by current in a conductive pathway in at least one of the first U-shaped wing layer, the Y-shaped wing layer, or the second U-shaped wing layer is at least partially canceled by a magnetic field induced by current in a corresponding conductive pathway in at least one other of the first U-shaped wing layer, the Y-shaped wing layer, or the second U-shaped wing layer.

4. The bus bar of claim 1, wherein each of the first U-shaped wing layer, the Y-shaped wing layer, and the second U-shaped wing layer provides a substantially discrete conductive pathway amongst the connector holes of a respective one of the first U-shaped wing layer, the Y-shaped wing layer, and the second U-shaped wing layer.

5. The bus bar of claim 1, wherein each of the first U-shaped wing layer, the Y-shaped wing layer, and the second U-shaped wing layer have substantially equal impedances to others of the first U-shaped wing layer, the Y-shaped wing layer, and the second U-shaped wing layer.

6. The bus bar of claim 1, wherein each of the first U-shaped wing layer, the Y-shaped wing layer, and the second U-shaped wing layer provide a conductive pathway of substantially equal in length to conductive pathways in others of the first U-shaped wing layer, the Y-shaped wing layer, and the second U-shaped wing layer.

7. The bus bar of claim 1, wherein each of the first U-shaped wing layer, the Y-shaped wing layer, and the second U-shaped wing layer defines an area between the connector holes in the first U-shaped wing layer, the Y-shaped wing layer, and the second U-shaped wing layer, respectively, where no conductive material is present.

8. A power electronic device comprising:
    a heat sink with a coolant inlet and a coolant outlet;
    first and second switch packages having supply terminals and load terminals, the supply terminals of the first and second switch packages are substantially thermally first and second switch packages are substantially thermally equidistant from the coolant inlet at a second thermal distance that is less than the first thermal distance; and
    at least one first current shaping terminal connector connecting the load terminals of the first and second switch packages, the at least one first current shaping terminal connector including a first U-shaped wing layer, a Y-shaped wing layer that is separate from the first U-shaped wing layer, and a second U-shaped wing layer that is separate from the first U-shaped wing layer and the Y-shaped wing layer, the Y-shaped wing layer sandwiched between the first and second U-shaped wing layers, each of the first U-shaped wing layer, the Y-shaped wing layer, and the second U-shaped wing layer including plural elongated ends having a connector hole in each of the elongated ends for electrical connections,
    wherein the Y-shaped wing layer includes a projecting tab having a pre-defined load location, the projecting tab extending from the Y-shaped wing layer in a direction that is between and opposite of directions in which the elongated ends that the Y-shaped wing layers are elongated, wherein the first U-shaped wing layer and the second U-shaped wing layer do not have the projecting tab extending in the direction that is between and oriented opposite of the directions in which the elongated ends that the first U-shaped wing layer and the second U-shaped wing layer are elongated.

9. The power electronic device of claim 8, wherein the first U-shaped wing layer, the Y-shaped wing layer, and the second U-shaped wing layer provide substantially discrete conductive pathways amongst the connector holes of a respective one of the first U-shaped wing layer, the Y-shaped wing layer, and the second U-shaped wing layer.

10. The power electronic device of claim 8, wherein the first U-shaped wing layer, the Y-shaped wing layer, and the second U-shaped wing layer define an area between the connector holes in each of the first U-shaped wing layer, the Y-shaped wing layer, and the second U-shaped wing layer where no conductive material is present.

11. The power electronic device of claim 8, further comprising:
    second and third current shaping terminal connectors respectively connected to the supply terminals of the first switch package and to the supply terminals of the second switch package, wherein the second and third current shaping terminals connectors are matching inverts of each other.

12. A bus bar comprising:
a first supply terminal connector having a first connection hole configured to be coupled with a supply terminal of a first switch package and a second connection hole configured to be coupled with a first current supply bus;
a second supply terminal connector insulated from the first supply terminal connector, the second supply terminal connector having a third connection hole that is configured to be coupled with a supply terminal of a second switch package and a fourth connection hole configured to be coupled with a second current supply bus; and
a load terminal connector insulated from the first supply terminal connector and the second supply terminal connector, the load terminal connector having a plurality of fifth connection holes that is configured to be coupled with load terminals of the first switch package and a plurality of sixth connection holes configured to be coupled with load terminals of the second switch package,
wherein at least one of the first supply terminal connector, the second supply terminal connector, or the load terminal connector is a current shaping terminal connector that includes one or more gaps that provide at least one substantially balanced conductive pathway between one or more of (a) the first connection hole and the second connection hole of the first supply terminal connector, (b) the third connection hole and the fourth connection hole of the second supply terminal connector, or (c) the fifth connection holes and the sixth connection holes of the load terminal connector,
wherein the load terminal connector includes plural wing layers, each of the wing layers includes a representative one of the fifth connection holes and a representative one of the sixth connection holes, the wing layers provide the at least one substantially balanced conductive pathway between a representative one of the fifth connection holes of each of the wing layers and a representative one of the sixth connection holes of each of the wing layers, each of the wing layers having the one or more gaps to form a shape that prevents a straight line conductive pathway between the representative one of the fifth connection holes and the representative one of the sixth connection holes in each of the wing layers.

13. The bus bar of claim 12, wherein the load terminal connector overlaps both the first supply terminal connector and the second supply terminal connector.

* * * * *